(12) United States Patent
Lovett

(10) Patent No.: US 7,319,629 B2
(45) Date of Patent: Jan. 15, 2008

(54) METHOD OF OPERATING A DYNAMIC RANDOM ACCESS MEMORY CELL

(75) Inventor: Simon J. Lovett, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/494,691

(22) Filed: Jul. 28, 2006

(65) Prior Publication Data

US 2006/0262612 A1 Nov. 23, 2006

Related U.S. Application Data

(62) Division of application No. 10/969,184, filed on Oct. 21, 2004, now Pat. No. 7,206,243, which is a division of application No. 10/436,166, filed on May 13, 2003, now Pat. No. 6,839,297, which is a division of application No. 10/225,423, filed on Aug. 22, 2002, now Pat. No. 6,750,497.

(51) Int. Cl.
*G11C 7/00* (2006.01)
(52) U.S. Cl. .................................. 365/222; 365/149
(58) Field of Classification Search ................ 365/149, 365/222, 149 X, 222 O
See application file for complete search history.

(56) References Cited

U.S. PATENT DOCUMENTS 4,716,552 A 12/1987 Maltiel et al.
5,345,423 A 9/1994 Koh et al.
5,414,654 A 5/1995 Kubota et al.
5,724,296 A 3/1998 Jang
RE36,180 E 4/1999 Lim
6,262,936 B1 7/2001 Arcoleo et al.
6,262,937 B1 7/2001 Arcoleo et al.
6,292,403 B1 9/2001 Pancholy et al.
6,317,358 B1 11/2001 Keeth
6,331,961 B1 12/2001 Kengeri et al.
6,385,128 B1 5/2002 Arcoleo et al.
6,388,934 B1 * 5/2002 Tobita ........................ 365/222
6,501,315 B1 12/2002 Nguyen
6,538,954 B2 3/2003 Kunikiyo
6,563,754 B1 5/2003 Lien et al.
6,646,907 B2 * 11/2003 Ooishi ........................ 365/149
6,819,602 B2 11/2004 Seo et al.
2002/0034114 A1 3/2002 Tobita

OTHER PUBLICATIONS

"Transparent-Refresh DRAM (TReD) Using Dual-Port DRAM Cell," by Takayasu Sakurai et al., IEEE 1988 Custom Integrated Circuits Conference, pp. 4.3.1-4.3.4.

(Continued)

Primary Examiner—VanThu Nguyen
(74) Attorney, Agent, or Firm—Dickstein Shapiro LLP

(57) ABSTRACT

A method of operating a dynamic random access memory cell is disclosed. The true logic state of a stored bit is rewritten to a first storage node of the memory cell and the complementary logic state of the stored bit is rewritten to a second storage node of the memory cell. One of the acts of rewriting is achievable faster than the other and the rewriting of the true and complementary logic states is completed upon achieving the one act of rewriting that is faster than the other.

12 Claims, 4 Drawing Sheets

OTHER PUBLICATIONS

"A High-Density Dual-Port Memory Cell Operation for ULSI DRAMs," by Hideto Hidaka et al., 1991 Symposium on VLSI Circuits, Digest of Technical Papers, May 30-Jun. 1, 1991, pp. 65 and 66.

"An 8-ns Random Cycle Embedded RAM Macro with Dual-Port Interleaved DRAM Architecture ($D^2RAM$)," by Yasuhiro Agata et al., IEEE Journal of Solid-State Circuits, vol. 35, No. 11, Nov. 2000, pp. 1668-1671.

* cited by examiner

METHOD OF OPERATING A DYNAMIC RANDOM ACCESS MEMORY CELL

This application is a divisional of application Ser. No. 10/969,184, filed Oct. 21, 2004, now U.S. Pat. No. 7,206 243 which is a divisional of application Ser. No. 10/436,166, filed May 13, 2003, now U.S. Pat. No. 6,839,297 which is a divisional of application Ser. No. 10/225,423, filed Aug. 22, 2002, now U.S. Pat. No. 6,750,497 the entire disclosure of each being incorporated herein by reference in its entirety.

FIELD OF THE INVENTION

The present invention relates generally to semiconductor memory, and more particularly to a high-speed dynamic random access memory (DRAM)-based memory cell having transparent refresh.

BACKGROUND OF THE INVENTION

In a dynamic random access memory ("DRAM"), data is stored as a logic HIGH (e.g., "1") or logic LOW (e.g., "0") by the presence or absence of charge on a capacitor within an individual memory cell. After the data has been stored as charge on the capacitor, the charge gradually leaks off and the data is corrupted. Therefore, a "refresh" cycle must be performed to maintain the integrity of the data.

To refresh data in a memory array, the array is typically placed in a read mode to obtain the present data stored in a row of memory cells. Subsequently, this data is used as new input data that is rewritten into the row of memory cells, thus maintaining the stored data.

A static random access memory (SRAM), as contrasted with a DRAM, holds its data for as long as power is supplied to the circuit without the need for a refresh cycle. The lack of necessity to refresh memory cell contents is one of the reasons why DRAM memory speeds lag that of SRAM. Along with the benefits of SRAM, however, comes a high manufacturing cost as compared with DRAM. A typical SRAM cell consists of 6 transistors as compared with one transistor for a DRAM cell. Notwithstanding the higher manufacturing costs and space requirements associated with SRAM cells, there are certain applications that can and do take advantage of the higher speeds associated with SRAMs. Accordingly, it would be advantageous to have the high-speed associated with SRAMs along with the lower manufacturing costs associated with DRAMs combined into a memory cell architecture having a hidden refresh.

BRIEF SUMMARY OF THE INVENTION

The present invention provides a high-speed transparent refresh DRAM-based memory cell and architecture. According to an exemplary embodiment of the invention, each memory cell consists of 4 transistors configured to incorporate differential data storage (i.e., storing a true logic state and a complementary logic state), with each pair of transistors having a dual port configuration and forming one of a complementary pair of storage nodes for the memory cell. Each memory cell is coupled to 2 wordlines and 4 digit lines. Since the memory cell stores complementary data, and since a logic LOW state is rewritten to a given memory cell faster than a logic HIGH state is rewritten, the logic LOW state is rewritten and the complementary logic state is known to be a logic HIGH state. As a result, by using complementary data states within each stored bit, both the logic LOW and logic HIGH states are rewritten to the memory cell faster than independently writing a logic HIGH state.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
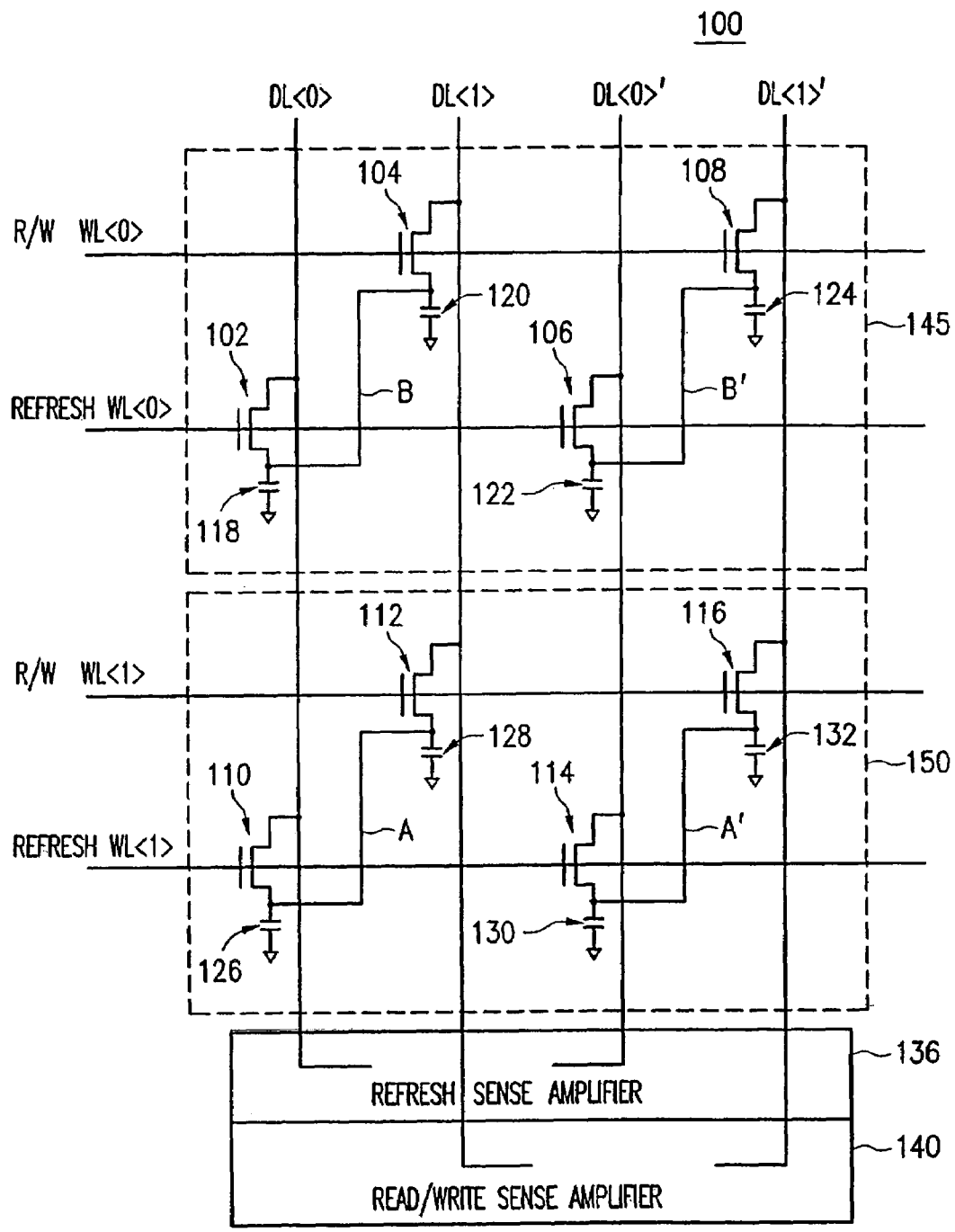
FIG. 1 depicts a simplified schematic diagram of a memory cell array, in accordance with an exemplary embodiment of the invention.

FIG. 1 depicts a simplified schematic diagram of a memory cell array 100 having two memory cells 145, 150 in accordance with an exemplary embodiment of the invention. The memory cell array consists of four digit lines DL<0>, DL<1>, DL<0>' and DL<1>' (depicted in the vertical direction) and four wordlines read/write wordline <0> (R/W WL<0>), refresh wordline <0>(Refresh WL<0>), R/W WL<1>, and Refresh WL<1> (depicted in the horizontal direction).

Turning first to memory cell 145, a first source/drain terminal of transistor 102 is coupled to DL<0>, a second source/drain terminal of transistor 102 is coupled to a first terminal of storage capacitor 118 and a gate of transistor 102 is coupled to Refresh WL<0>. A second terminal of storage capacitor 118 is coupled to ground (or some other static potential). A first source/drain terminal of transistor 104 is coupled to DL<1>, a second source/drain terminal of transistor 104 is coupled to a first terminal of storage capacitor 120 and a gate of transistor 104 is coupled to R/W WL<0>. A second terminal of storage capacitor 120 is coupled to ground (or some other static potential). Further, the second source/drain terminal of transistor 102 is coupled to the second source/drain terminal of transistor 104 and forms storage node B.

A first source/drain terminal of transistor 106 is coupled to DL<0>', a second source/drain terminal of transistor 106 is coupled to a first terminal of storage capacitor 122 and a gate of transistor 106 is coupled to Refresh WL<0>. A second terminal of storage capacitor 122 is coupled to ground (or some other static potential). A first source/drain terminal of transistor 108 is coupled to DL<1>', a second source/drain terminal of transistor 108 is coupled to a first terminal of storage capacitor 124 and a gate of transistor 108 is coupled to R/W WL<0>. A second terminal of storage capacitor 124 is coupled to ground (or some other static potential). Further, the second source/drain terminal of transistor 106 is coupled to the second source/drain terminal of transistor 108 and forms storage node B'. Storage node B' stores the complementary logic state of that stored by storage node B.

Still referring to FIG. 1, and turning now to memory cell 150, a first source/drain terminal of transistor 110 is coupled to DL<0>, a second source/drain terminal of transistor 110 is coupled to a first terminal of storage capacitor 126 and a gate of transistor 110 is coupled to Refresh WL<1>. A second terminal of storage capacitor 126 is coupled to ground (or some other static potential). A first source/drain terminal of transistor 112 is coupled to DL<1>, a second source/drain terminal of transistor 112 is coupled to a first terminal of storage capacitor 128 and a gate of transistor 112 is coupled to R/W WL<1>. A second terminal of storage capacitor 128 is coupled to ground (or some other static potential). Further, the second source/drain terminal of transistor 110 is coupled to the second source/drain terminal of transistor 112 and forms storage node A.

A first source/drain terminal of transistor 114 is coupled to DL<0>', a second source/drain terminal of transistor 114 is coupled to a first terminal of storage capacitor 130 and a gate of transistor 114 is coupled to Refresh WL<1>. A second terminal of storage capacitor 130 is coupled to ground (or some other static potential). A first source/drain terminal of transistor 116 is coupled to DL<1>', a second source/drain terminal of transistor 116 is coupled to a first terminal of storage capacitor 132 and a gate of transistor 116 is coupled to R/W WL<1>. A second terminal of storage capacitor 132 is coupled to ground (or some other static potential). Further, the second source/drain terminal of transistor 114 is coupled to the second source/drain terminal of transistor 116 and forms storage node A'. Storage node A' stores the complementary logic state of that stored by storage node A.

Digit lines DL<0> and DL<0>' are coupled to refresh sense amplifier 136 for detecting contents of the storage nodes during a scheduled refresh operation and for rewriting those contents to the proper storage node. Digit lines DL<1> and DL<1>' are coupled to read/write sense amplifier 140 for detecting contents of the storage nodes during a read operation and for writing back those contents once they are read. Further, for a write operation, read/write sense amplifier 140 controls the writing of a logic state to the storage nodes.

Still referring to FIG. 1, transistor pair 102 and 104 form a first dual port portion of memory cell 145 and transistor pair 106 and 108 form a second, complementary, dual port portion of memory cell 145. The first dual port portion of memory cell 145 forms storage node B. The second dual port portion of memory cell 145 forms storage node B'.

Transistor pair 110 and 112 form a first dual port portion of memory cell 150 and transistor pair 114 and 116 form a second dual port portion of memory cell 150. The first dual port portion of memory cell 150 forms storage node A. The second dual port portion of memory cell 150 forms storage node A'.

Figure 2:
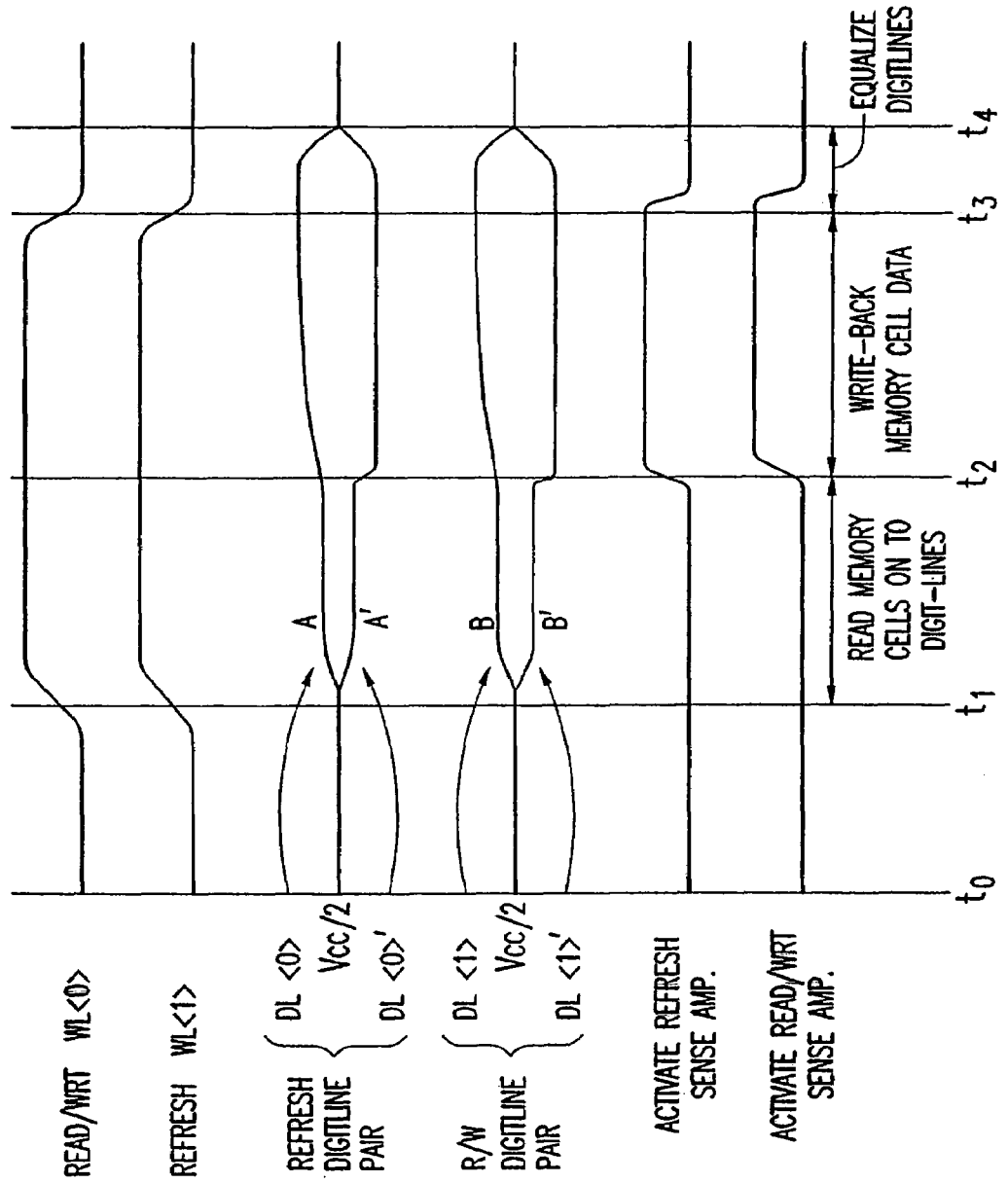
FIG. 2 depicts a timing diagram of the operation of the FIG. 1 memory cell array, in accordance with an exemplary embodiment of the invention.

Turning to FIG. 2, a timing diagram of the operation of the FIG. 1 memory cell array 100 is depicted in accordance with an exemplary embodiment of the invention. At time $t_0$, the digit lines DL<0>, DL<0>', DL<1> and DL<1>' are equilibrated to a predetermined initial voltage level (e.g., VCC/2). At time $t_1$, RW WL<0> goes logic HIGH (e.g., "1") signifying that a read/write operation is occurring at memory cell 145 and activates transistors 104 and 108. In addition, at $t_1$, Refresh WL<1> goes logic HIGH (e.g., "1") signifying that a refresh operation is occurring at memory cell 150 and activates transistors 110 and 114.

In accordance with an exemplary embodiment of the invention, the refresh operation acts in the background and is independent of any read/write operations being performed on the array 100. A read/write operation of one memory cell (e.g., memory cell 145) may occur simultaneously with a refresh operation of another memory cell (e.g., memory cell 150) in array 100. This is made possible by the independent digit lines for read/write and refresh operations. A read operation essentially performs a refresh since the contents of the memory cell must be rewritten once they are read. In the case of a conflict between a read/write operation and the hidden refresh operation (which operates to refresh data being stored in predetermined addresses in a predetermined sequence), the refresh operation is cancelled and the next address in the sequence is refreshed.

Still referring to FIG. 2, at time t1, the contents of storage nodes B, B', A and A' are respectively read by digit lines DL<1>, DL<1>', DL<0> and DL<0>'. For purposes of this description, it is assumed that storage nodes A and B are storing bits having a logic HIGH (e.g., "1") state. Therefore, storage nodes A' and B' are storing bits having a logic LOW (e.g., "0") state.

As can be seen at FIG. 2, at time $t_1$, the digit lines begin to detect a difference in voltage being stored by respective nodes. For example, digit line DL<0>, coupled to storage node A, begins to detect its voltage level rising from the equilibrated voltage level of e.g., VCC/2. For purposes of this description, it will be assumed that the equilibrated voltage level is 0.9V.

Continuing the example from above, digit line DL<0>', coupled to storage node A', begins to detect its voltage level dropping from the equilibrated voltage level of 0.9V. Since the voltage levels of digit lines DL<0> and DL<0>' are moving in opposite directions, owing to the complementary data states, it does not require much elapsed time before a determination can be made as to what logic state is being stored by each node.

Similarly, digit line DL<1>, coupled to storage node B, begins to detect its voltage level rising from the equilibrated voltage level of 0.9V and digit line DL<1>', coupled to storage node B', begins to detect its voltage level dropping from the equilibrated voltage level of 0.9V.

At time $t_2$, the refresh sense amplifier 136 and the R/W sense amplifier 140 are enabled. As a result, the respective differences between A and A', and B and B' are amplified and brought to corresponding rail levels. That is, the nodes detected as being above the equilibrated voltage level (e.g., nodes A and B), are driven to a first predetermined voltage level (e.g., VCC). For purposes of this description, VCC will be assumed to be 1.8V. The nodes detected as being below the equilibrated voltage level (e.g., nodes A' and B'), are driven to ground.

Also, at time $t_2$, the respective contents of nodes A, A', B and B' are written back to the memory cells 145, 150. In accordance with an exemplary embodiment of the invention, since n-channel pass transistors are used in the memory array 100, as depicted in FIG. 1, and since a logic LOW (e.g., "0") state is written to a given n-channel pass transistor/capacitor pair much more rapidly than a logic HIGH (e.g., "1") state is written to such a transistor/capacitor pair, the data can be rewritten back to the storage nodes faster than in the past by writing the logic LOW state at the same time as writing the logic HIGH state.

At time $t_3$, the wordlines are de-asserted. Then, at time $t_4$, the sense amplifiers are disabled and the digit lines are equilibrated back to their quiescent level (e.g., VCC/2, or 0.9V).

That is, in accordance with an exemplary embodiment of the invention, the data is considered as being rewritten to the storage nodes in the time it takes to write a logic LOW state to the appropriate node (e.g., nodes A' and B' in this example). Although the logic HIGH state will not have been "properly" rewritten back to the node in the same timeframe as did the logic LOW state, the "poorly" represented logic HIGH state is still distinguishable from the logic LOW state since it must be the complement of the node written to with a logic LOW state. That is, the logic state must be HIGH if the bit written to the complementary node is a logic LOW.

In accordance with an exemplary embodiment of the invention, approximately 0.5 nanoseconds are required in order to write a logic LOW state back into the node (i.e., dropping from the equilibrated voltage of 0.9V down to 0V). Under ordinary circumstances, writing a logic HIGH state requires approximately 8 nanoseconds to go from the equilibrated voltage level (e.g., 0.9V) up to a voltage level enabling a determination of a logic HIGH state (e.g., 1.9V). Here, a memory cell architecture and method are provided that allow both logic LOW and logic HIGH states to be rewritten to respective storage nodes in the same amount of time normally required to rewrite a logic LOW state (e.g., 0.5 nanoseconds). This is achieved by providing both a true logic state and a complementary logic state in two storage nodes of a memory cell.

In accordance with an exemplary embodiment of the invention, although the voltage level of the storage node storing the logic HIGH state (e.g., node A) cannot reach the level of VCC (e.g., 1.8V) in the allotted timeframe (e.g., 0.5 nanoseconds), and in fact, is more likely to be in the 1.1V-1.2V range, a logic HIGH state is nonetheless correctly detected. This is possible since the logic state being written to the storage node (e.g., node A) is the complement of the logic LOW state fully written to the other storage node (e.g., node A').

Figure 3:
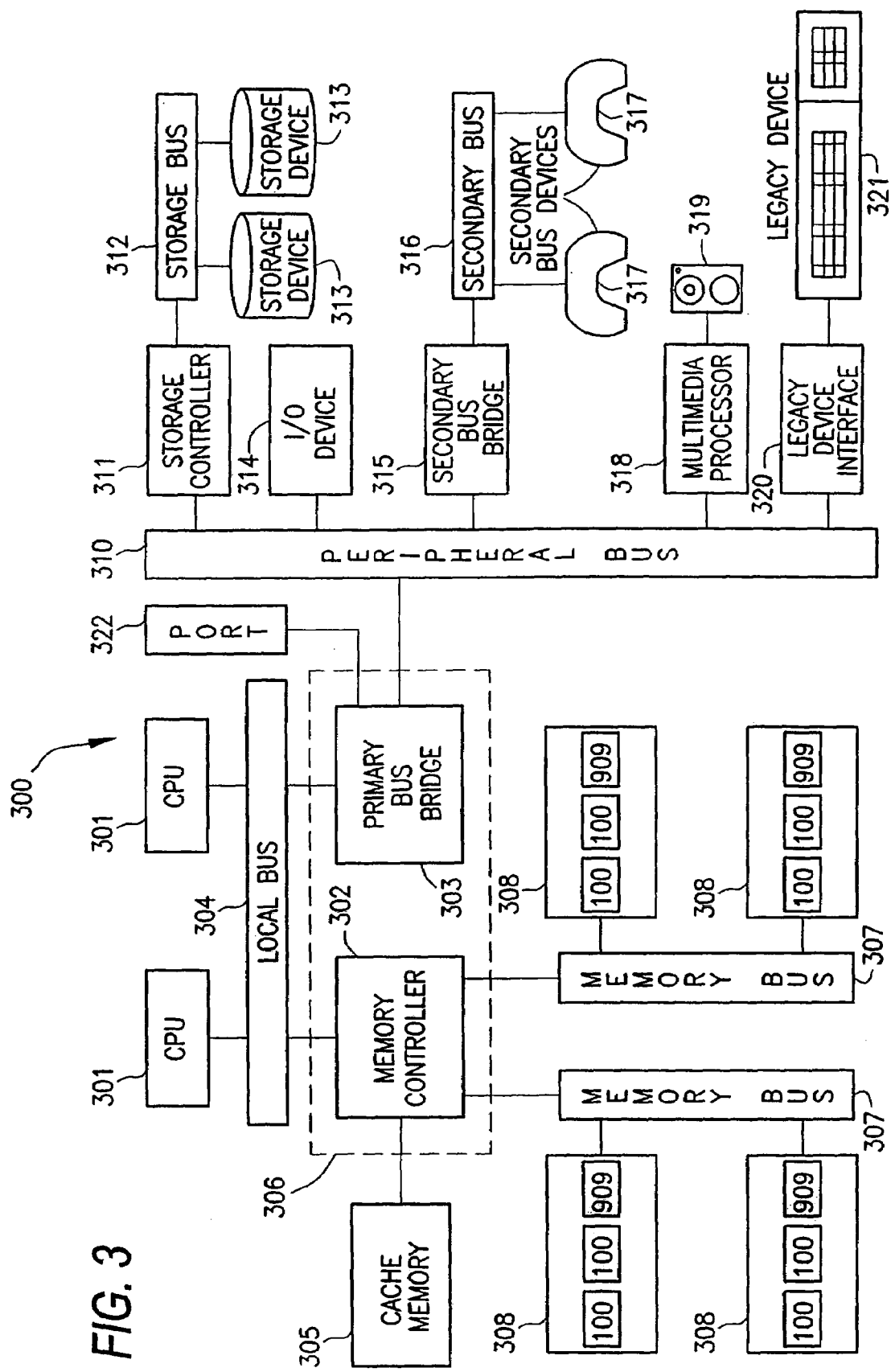
FIG. 3 depicts a processor system incorporating the memory cell array of FIG. 1.

Turning now to FIG. 3, an exemplary processing system 300 which may utilize the high-speed transparent refresh DRAM-based memory array 100 of the present invention is depicted. The processing system 300 includes one or more processors 301 coupled to a local bus 304. A memory controller 302 and a primary bus bridge 303 are also coupled to the local bus 304. The processing system 300 may include multiple memory controllers 302 and/or multiple primary bus bridges 303. The memory controller 302 and the primary bus bridge 303 may be integrated as a single device 306.

The memory controller 302 is also coupled to one or more memory buses 307. Each memory bus accepts memory components 308 which include at least one high-speed transparent refresh DRAM-based memory array 100 of the present invention. The memory components 308 may be a memory card or a memory module. Examples of memory modules include single inline memory modules (SIMMs) and dual inline memory modules (DIMMs). The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 300 includes peripherals or controllers which are bus masters or which support direct memory access (DMA), the memory controller 302 may implement a cache coherency protocol. If the memory controller 302 is coupled to a plurality of memory buses 307, each memory bus 307 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, a miscellaneous I/O device 314, a secondary bus bridge 315, a multimedia processor 318, and a legacy device interface 320. The primary bus bridge 303 may also be coupled to one or more special purpose high speed ports 322. In a personal computer, for example, the special purpose port might be the Accelerated Graphics Port (AGP), used to couple a high performance video card to the processing system 300.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be a local area network interface, such as an Ethernet card. The secondary bus bridge may be used to interface additional devices via another bus to the processing system. For example, the secondary bus bridge may be a universal serial port (USB) controller used to couple USB devices 317 to the processing system 300. The multimedia processor 318 may be a sound card, a video capture card, or any other type of media interface, which may also be coupled to additional devices such as speakers 319. The legacy device interface 320 is used to couple legacy devices, for example, older styled keyboards and mice, to the processing system 300.

The processing system 300 illustrated in FIG. 3 is only an exemplary processing system with which the invention may be used. While FIG. 3 illustrates a processing architecture especially suitable for a general purpose computer, such as a personal computer or a workstation, it should be recognized that well known modifications can be made to configure the processing system 300 to become more suitable for use in a variety of applications. For example, many electronic devices which require processing may be implemented using a simpler architecture which relies on a CPU 301 coupled to memory components 308 and/or the high-speed transparent refresh DRAM-based memory array 100. These electronic devices may include, but are not limited to audio/video processors and recorders, gaming consoles, digital television sets, wired or wireless telephones, navigation devices (including systems based on the global positioning system (GPS) and/or inertial navigation), and digital cameras and/or recorders. The modifications may include, for example, elimination of unnecessary components, addition of specialized devices or circuits, and/or integration of a plurality of devices.

Figure 4:
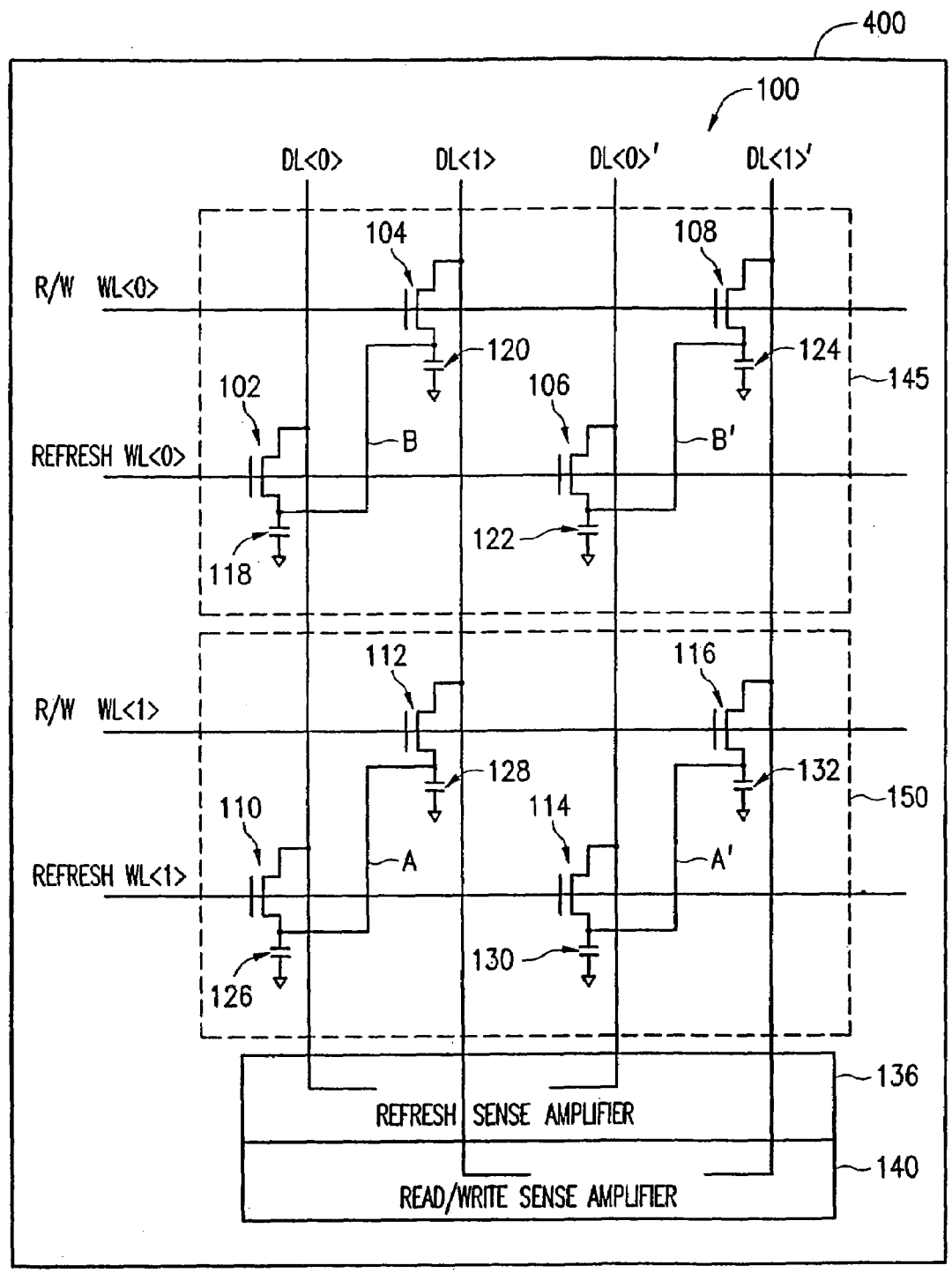
FIG. 4 depicts the FIG. 1 memory cell array on a semiconductor chip.

FIG. 4 depicts the memory cell array 100 of FIG. 1 situated on a semiconductor memory chip 400 so that it may be incorporated into a processor system such as the one depicted in FIG. 3.

It is desirable to have a high-speed transparent refresh DRAM-based memory cell (e.g., 145 of FIG. 1) that operates at speeds normally associated with 6 transistor SRAM technology and that lends itself to the relatively low manufacturing costs associated with DRAM technology. The present invention accomplishes this by providing a memory cell architecture consisting of 4 transistors (e.g., 102-108)

configured to incorporate differential data storage (i.e., storing a true logic state and a complementary logic state), with each pair of transistors having a dual port configuration and forming one of a complementary pair of storage nodes (e.g., B and B'). Each memory cell 145 is coupled to 2 wordlines (e.g., R/W WL<0>, Refresh WL<0>) and 4 digit lines (e.g., DL<0>, DL<1>, DL<0>', DL<1>'). Since th cell 145 stores complementary data (B, B'), and since a logic LOW state (e.g., "0") is rewritten to a given memory cell faster than a logic HIGH state (e.g., "1") is rewritten, the logic LOW state is rewritten and the logic HIGH state is distinguishable from the logic LOW state since they are complementary states. As a result, both the logic LOW and the logic HIGH states are rewritten to the memory cell 145 faster than a logic HIGH state could be independently rewritten. Since the refresh is hidden, an exemplary application for the invention is use as a replacement for 6 transistor fast SRAM technology.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although an exemplary embodiment of the invention has been described in connection with only 2 memory cells, 145, 150 in memory cell array 100, it should be readily apparent that any number of memory cells may be incorporated into memory cell array 100. In addition, although an exemplary embodiment of the invention depicts 2 storage capacitors (e.g., 118, 120) for each dual port transistor configuration (e.g., transistors 102 and 104), it should be readily apparent that each pair of transistors forming a storage node may share one storage capacitor.

Further, although an exemplary embodiment of the invention has been described in connection with referencing a rewrite of a logic HIGH state with a voltage level associated with a logic LOW state, rather than a reference voltage level, it should be readily understood that the reverse can be achieved through the use of p-channel pass transistors. That is, if p-channel pass transistors were to replace transistors 102-116, a logic HIGH state could be rewritten back into the memory cell faster than a logic LOW state could be rewritten. Therefore, the rewrite of the logic LOW state could then be referenced to the logic HIGH state, rather then a reference voltage level.

Moreover, while the operation of the FIG. 1 memory cell array 100 is described in connection with the FIG. 2 timing diagram, it should be readily understood that the specific logic states described in connection with FIG. 2 can easily be reversed and/or otherwise modified. Accordingly, the invention is not limited by the foregoing description or drawings, but is only limited by the scope of the appended claims.

The invention claimed is:

1. A method of operating a dynamic random access memory cell, the method comprising:
   receiving an enable signal from one of a refresh wordline and a read/write wordline coupled to said memory cell;
   sensing a true logic state and a complementary logic state of a bit respectively stored by first and second storage nodes of said memory cell via one of two digit line pairs coupled to said memory cell, a first digit line pair being made up of a first digit line and a third digit line, a second digit line pair being made up of a second digit line and a fourth digit line;
   respectively rewriting said true logic state and said complementary logic state into said first and second storage nodes via said one of said first and second digit line pairs,
   wherein said act of rewriting is completed when one of said true and complementary logic states is rewritten to said memory cell.

2. The method of claim 1, wherein sensing the true logic state comprises:
   charging a first storage capacitor of said first storage node to a voltage level corresponding to said true logic state, said voltage level corresponding to said true logic state being sensed with respect to said reference voltage level.

3. The method of claim 2, wherein said act of charging said first storage capacitor of said first storage node comprises:
   charging said first storage capacitor of said first storage node to a logic LOW state.

4. The method of claim 3, wherein sensing the complementary logic state comprises:
   charging a second storage capacitor of said second storage node to a voltage level corresponding to said complementary logic state, said voltage level corresponding to said complementary logic state being sensed with respect to said voltage level corresponding to said true logic state.

5. The method of claim 4, wherein said act of charging said second storage capacitor of said second storage node comprises:
   charging said second storage capacitor of said second storage node to a logic HIGH state.

6. The method of claim 1, wherein sensing the complementary logic state comprises:
   charging a first storage capacitor of said second storage node to a voltage level corresponding to said complementary logic state, said voltage level corresponding to said complementary logic state being sensed with respect to said reference voltage level.

7. The method of claim 6, wherein said act of charging said first storage capacitor of said second storage node comprises:
   charging said first storage capacitor of said second storage node to a logic HIGH state.

8. The method of claim 6, wherein sensing the true logic state comprises:
   charging a second storage capacitor of said first storage node to a voltage level corresponding to said true logic state, said voltage level corresponding to said true logic state being sensed with respect to said voltage level corresponding to said complementary logic state.

9. The method of claim 8, wherein said act of charging said second storage capacitor of said first storage node comprises:
   charging said second storage capacitor of said first storage node to a logic LOW state.

10. A method of operating a dynamic random access memory cell, the method comprising:
    receiving an enable signal from one of a refresh wordline and a read/write wordline coupled to said memory cell;
    sensing a true logic state and a complementary logic state of a bit respectively stored by first and second storage nodes of said memory cell via one of two digit line pairs coupled to said memory cell, a first digit line pair being made up of a first digit line and a third digit line, a second digit line pair being made up of a second digit line and a fourth digit line;
    respectively rewriting said true logic state and said complementary logic state into said first and second storage nodes via said one of said first and second digit line pairs, wherein one of said true logic state and said complementary logic state is rewritten faster than the other, and wherein the act of rewriting ends when the faster of said true and complementary logic states is rewritten to said memory cell.

11. The method of claim 10, wherein a LOW logic state is rewritten faster than a HIGH logic state.

12. The method of claim 11, wherein the act of rewriting ends when the LOW logic state is rewritten.

* * * * *